United States Patent
Kim

(10) Patent No.: US 7,141,852 B2
(45) Date of Patent: Nov. 28, 2006

(54) SEMICONDUCTOR DEVICE AND FABRICATING METHOD THEREOF

(75) Inventor: Yung Pil Kim, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 28 days.

(21) Appl. No.: 11/027,837

(22) Filed: Dec. 29, 2004

(65) Prior Publication Data

US 2005/0164462 A1    Jul. 28, 2005

(30) Foreign Application Priority Data

Dec. 31, 2003 (KR) ...................... 10-2003-0101784

(51) Int. Cl.
*H01L 29/94* (2006.01)
(52) U.S. Cl. ...................... 257/344; 257/336; 257/408; 257/E21.002; 438/301; 438/302; 438/303; 438/306
(58) Field of Classification Search ................ 257/336, 257/344, 408; 438/301, 302, 303, 306
See application file for complete search history.

(56) References Cited

U.S. PATENT DOCUMENTS

| 6,274,906 B1* | 8/2001 | Kim et al. | ................... 257/336 |
| 2005/0029682 A1* | 2/2005 | Koh | ........................... 257/900 |

* cited by examiner

*Primary Examiner*—Zandra V. Smith
*Assistant Examiner*—Christy Novacek
(74) *Attorney, Agent, or Firm*—Andrew D. Fortney

(57) ABSTRACT

A semiconductor device and fabricating method are provided, by which device drivability can be increased by forming second LDD regions after isolating first LDD regions from source/drain regions to prevent heavily doped impurities therein from diffusing into the first LDD regions and to provide stepped densities within the LDD regions. The method includes the steps of stacking oxide and conductive layers on a semiconductor substrate, forming a gate electrode by patterning the conductive layer, etching the exposed substrate to a first depth, forming a first LDD region in the etched substrate, forming a spacer on a sidewall of the gate electrode, forming a source/drain region in the substrate having the spacer, etching the substrate having the source/drain region to a second depth, and forming a second LDD region between the first LDD region and the source/drain region of the etched substrate.

14 Claims, 4 Drawing Sheets

SEMICONDUCTOR DEVICE AND FABRICATING METHOD THEREOF

This application claims the benefit of the Korean Application No. P2003-101784 filed on Dec. 31, 2003, which is hereby incorporated by reference.

BACKGROUND OF THE INVENTION

1. Field of the Invention

The present invention relates to a semiconductor device and fabricating method thereof that can reduce a drain leakage current generated from a horizontal electric field of a gate electrode.

2. Discussion of the Related Art

Generally, semiconductor devices are being highly integrated, whereby transistors are decreasing in size. Specifically, until relatively recently, drain leakage current has been primarily generated from a vertical electric field. Yet, transistor channel lengths in semiconductor devices have been reduced in accordance with an increased integration degree, whereby the main concern about the leakage current is that caused by a horizontal electric field.

A low-voltage N-channel metal oxide semiconductor field effect transistor device generally employs an LDD (lightly doped drain) junction structure to enhance the hot-carrier effect. The hot-carrier effect is sometimes also called high-temperature electron effect or hot electron effect. If a channel length of a transistor is shortened without changing a voltage applied between a drain and source, an electric field within a depletion layer provided to a drain end of the channel increases. Hence, electrons are accelerated at high speed to collide with atoms, thereby bringing about an avalanche phenomenon. The highly accelerated electrons may also enter a gate oxide layer to be trapped therein, thereby varying a threshold voltage of the transistor, as well as causing leakage current, making the operation of the transistor unstable. In order to weaken the electric field within the depletion layer of the drain, a drain layer doped lighter than the drain is further provided to the drain, which is called LDD.

A method of fabricating a semiconductor device having a conventional LDD is explained with reference to the attached FIGS. 1A to 1E.

Referring to FIG. 1A, an oxide layer 2 and a conductive layer 3 are sequentially stacked on a semiconductor substrate. Namely, the oxide layer 2 for forming a gate insulating layer and the conductive layer 3 for forming a gate electrode are stacked on the semiconductor substrate 1 provided with a device isolation area (not shown), in turn. The device isolation area can be formed by LOCOS (local oxidation of silicon) or STI (shallow trench isolation).

Referring to FIG. 1B, a gate electrode 4 is formed by patterning. Namely, the conductive layer 3 and the oxide layer 2 shown in FIG. 1A are photolithographically patterned and etched using a mask to form the gate electrode 4 and the gate insulating layer 3 to provide the structure shown.

Referring to FIG. 1C, LDD regions 5 are formed. Namely, impurity ions are implanted into an exposed surface of the semiconductor substrate 1 at a light dopant density to form the LDD regions 5 in the vicinity of the gate electrode 4. In doing so, N-type impurities are lightly implanted for the LDD regions of an N-type transistor, whereas P-type impurities are lightly implanted for the LDD regions of a P-type transistor.

Referring to FIG. 1D, sidewall spacers 6 are formed on sidewalls of the gate electrode 4. Namely, an oxide layer and a nitride layer are blanket deposited onto the structure of FIG. 1C and anisotropically etched to form the spacer oxide 6a and spacer nitride 6b on the sidewalls of the gate electrode. Alternatively, the spacer 6 can be formed from a single layer of either nitride or oxide. Yet, a dual layer, as shown in the drawing, is frequently used to enhance a leakage current characteristic (e.g., reduce the leakage current) of a highly integrated device.

Referring to FIG. 1E, a source and drain configuring the transistor are formed. Namely, impurity ion implantation is carried out on the resultant structure shown in FIG. 1D to form the source/drain terminals 7 of the transistor. In doing so, the source/drain 7 are doped with either N- or P-type impurity ions as well. Specifically, photoresist is coated on the result structure shown in FIG. 1D, a PMOS area is exposed only, and p+ ion implantation is then heavily carried out thereon to form p+ source and drain. Thereafter, a photoresist pattern exposing an NMOS area only is formed and n+ ion implantation is then heavily carried out thereon to form n+ source and drain.

Yet, the semiconductor device fabricated by the above-explained method is disadvantageous in that the drain leakage current caused by the electric field of the gate electrode in a horizontal direction may be increased. Namely, in case of applying high and low voltages to gate and drain electrodes, respectively, a leakage current may be generated between the drain and the semiconductor substrate by band-to-band tunneling in a region of overlap between the gate electrode and the lightly doped drain (LDD) region (the "overlap region").

To reduce the leakage current, the heavily doped impurities are prevented from diffusing into the LDD region, or a width of the sidewall spacer is increased to extend the LDD. However, limitations are put on the current equipment in lowering the density of the LDD region. And, in the case of extending the spacer width, the operational speed and/or integration degree of the device may be lowered (e.g., the transistor consumes a greater area and may take a longer time to become conducting or non-conducting, as the case may be).

Meanwhile, Korean Patent Public Laid-Open No. 2000-43209 discloses a semiconductor device fabricating method. First, in fabricating CMOS provided with buried PMOS and NMOS, light impurity ion implantation is carried out twice to form LDD regions in junctions between a semiconductor substrate and source/drain regions in a part in the vicinity of a surface of the semiconductor substrate and another part lower than the surface of the semiconductor substrate. The source/drain regions are then formed. Hence, it is able to prevent a punch-thru path from occurring in the buried PMOS, whereby characteristics and reliability of the semiconductor device can be enhanced. Yet, such a method needs a process of forming a separate spacer for providing the second LDD regions, thereby complicating the manufacturing process.

U.S. Pat. No. 6,586,306 (Lee, et al.) discloses a CMOS semiconductor device fabricating method. First of all, in photolithography for forming LDD regions of an input/output device having a gate insulating layer thicker than that of a core device, portions of source/drain regions in the vicinity of an edge of a device isolation insulating layer in the core device area are partially exposed. The partially exposed portions are simultaneously ion-implanted on performing ion implantation for forming the LDD regions of the input/output device, whereby a deep junction is formed in the vicinity of the device isolation insulating layer without affecting a channel region of the core device to prevent junction leakage current from increasing. Hence, the process yield and reliability of device operation can be enhanced. Yet, such a method needs a separate mask for forming the second LDD regions, thereby complicating the manufacturing process and increasing its cost.

SUMMARY OF THE INVENTION

Accordingly, the present invention is directed to a semiconductor device and fabricating method thereof that substantially obviate one or more problems due to limitations and disadvantages of the related art.

An object of the present invention is to provide a semiconductor device and fabricating method thereof, by which device drivability can be raised and in which second LDD regions may be formed after isolating LDD regions from source/drain regions to prevent heavily doped impurities from diffusing into the LDD regions and to provide stepped dopant densities within the LDD regions.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device according to the present invention includes first LDD regions and source/drain regions provided to a semiconductor substrate, a channel region between the first LDD regions, a gate insulating layer on semiconductor substrate overlapping with the channel region, a gate electrode on the gate insulating layer also overlapping with the channel region, a spacer on a sidewall of the gate electrode, and second LDD regions provided between the first LDD regions and the source/drain regions, respectively, wherein the semiconductor substrate has a stepped shape to separate the first LDD regions from the source/drain regions, respectively.

Preferably, the second LDD regions have an impurity density higher than that of the first LDD regions but lower than that of the source/drain regions.

Preferably, a height of the stepped shape of the semiconductor substrate is equal to or smaller than 500 Å.

In another aspect of the present invention, a method of fabricating a semiconductor device includes the steps of stacking an oxide layer and a conductive layer on a semiconductor substrate, forming a gate electrode by patterning at least the conductive layer, etching the exposed substrate (i.e., not overlapped by the gate electrode) to a first depth, forming a first LDD region in the etched substrate, forming a spacer on a sidewall of the gate electrode, forming a source/drain region in the substrate having the spacer, etching the substrate having the source/drain region to a second depth, and forming a second LDD region between the first LDD region and the source/drain region of the etched substrate.

Preferably, the semiconductor substrate is etched to the first depth using an etch mask for forming the gate electrode.

Preferably, the first depth is equal to or smaller than 500 Å.

Preferably, the substrate is etched to the second depth using the gate electrode and the spacer as an etch mask.

Preferably, the second depth is greater than the first depth, and more preferably, the second depth is equal to or smaller than 500 Å (but greater than the first depth).

Preferably, the second LDD region has an impurity density higher than that of the first LDD region but lower than that of the source/drain region.

Preferably, the second LDD region is formed by ion implantation at an implantation angle of from 10° to about 80°.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First of all, a semiconductor device according to the present invention includes first LDD regions and source/drain regions in a semiconductor substrate, a channel region between the first LDD regions, a gate insulating layer on the channel region, a gate electrode on the gate insulating layer overlapping with the channel region, a spacer on a sidewall of the gate electrode, and second LDD regions provided between the first LDD regions and the source/drain regions, respectively, wherein the substrate has a stepped shape to separate the first LDD regions from the source/drain regions, respectively and wherein the second LDD regions have an impurity density higher than that of the first LDD regions but lower than that of the source/drain regions.

FIGS. 2A to 2F are cross-sectional diagrams for explaining a method of fabricating the above-configured semiconductor device according to the present invention.

Figure 1A:
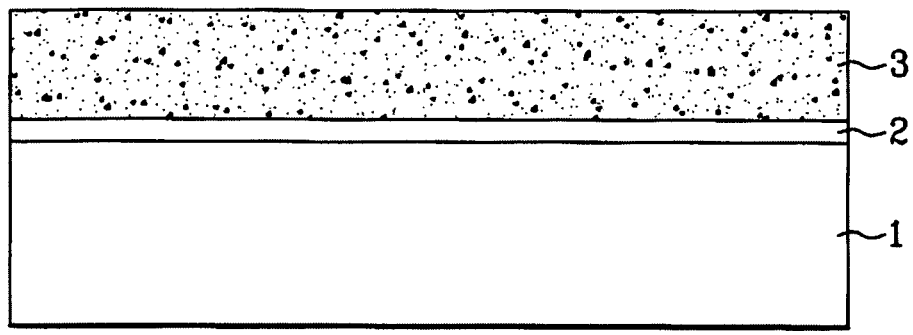
FIGS. 1A to 1E are cross-sectional diagrams for explaining a conventional method of fabricating a semiconductor device.
Figure 1B:
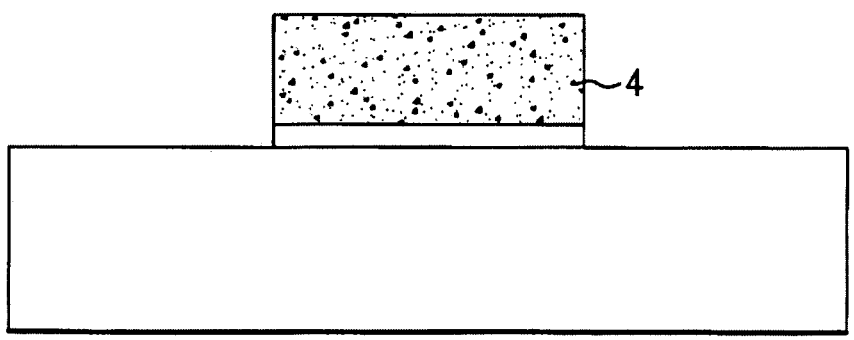
Figure 1C:
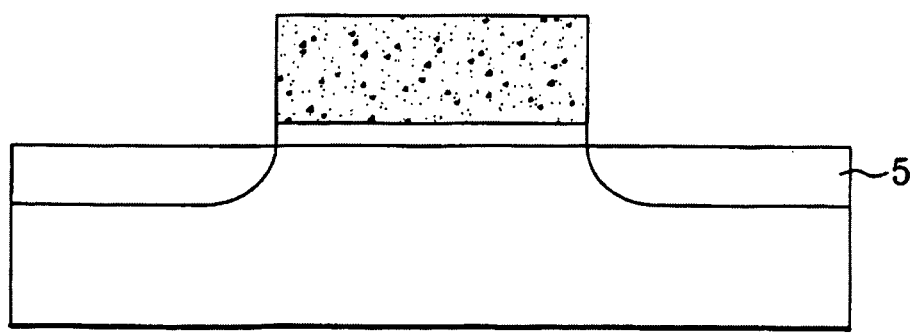
Figure 1D:
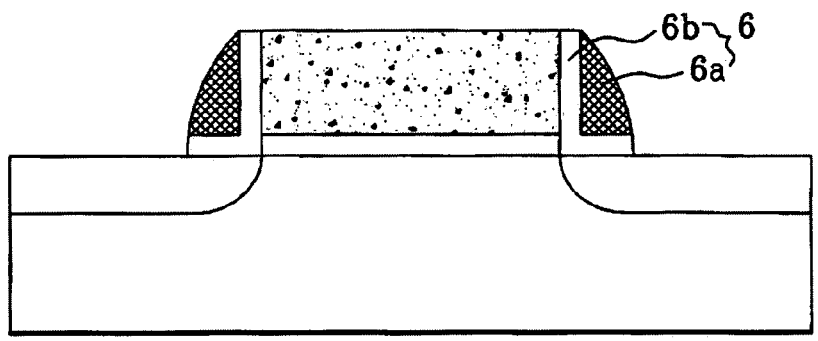
Figure 1E:
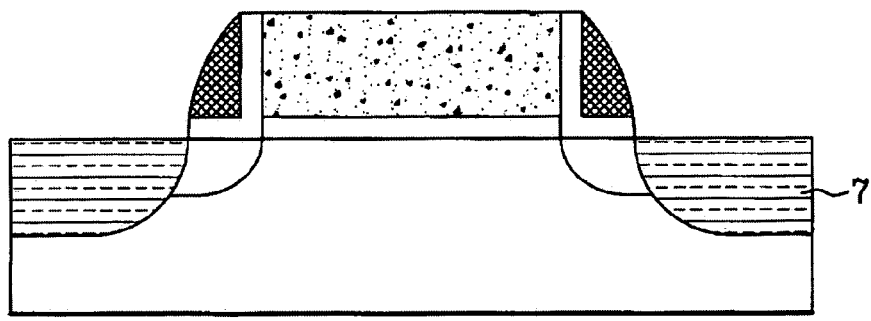
Figure 2A:
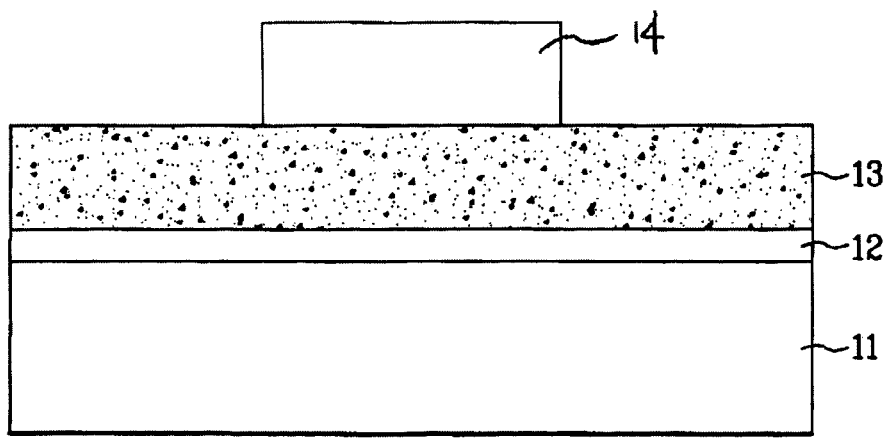
FIGS. 2A to 2F are cross-sectional diagrams for explaining a method of fabricating a semiconductor device according to the present invention.

Referring to FIG. 2A, an oxide layer 12, conductive layer 13, and photoresist 14 are stacked on a semiconductor substrate 11 in turn, and the photoresist 14 is then patterned to form a photoresist pattern 14. Namely, a gate oxide layer, a gate electrode conductive layer, and photoresist are sequentially stacked on a semiconductor substrate having a device isolation area. Then, the photoresist is exposed and developed to form the photoresist pattern 14, for example.

Figure 2B:
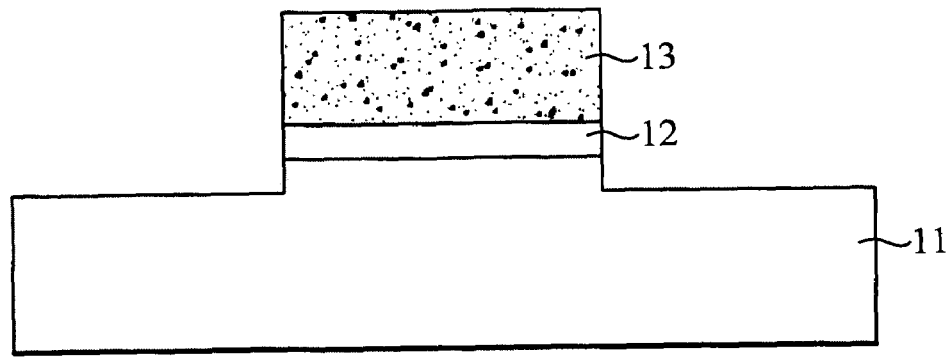

Referring to FIG. 2B, the conductive and insulating layers are patterned and the substrate is further etched to a prescribed depth. Namely, the gate insulating layer 12 and the gate electrode conductive layer 13 are etched using the photoresist pattern as an etch mask, and the substrate 11 is then etched using the photoresist pattern as an etch mask again. Preferably, the substrate is etched to a depth not to exceed 500 Å. Subsequently, the photoresist pattern 14 is removed by ashing, stripping or the like, resulting in the structure shown in FIG. 2B.

Figure 2C:
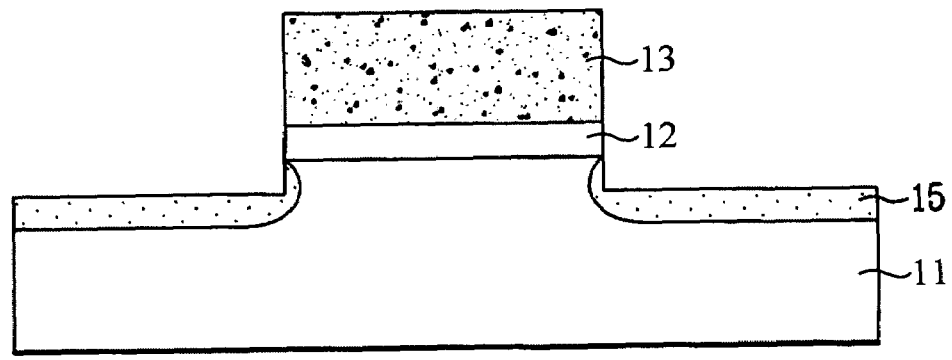

Referring to FIG. 2C, first LDD regions 15 (very lightly doped source and drain implants, or VLDD implants) are formed. Namely, impurity ions having a polarity opposite to that of the substrate are lightly implanted into the substrate using the gate electrode as an implantation mask to form the first LDD regions 15. Hence, the first LDD regions 15, which are formed in the stepped substrate 11, are wider than those of the related art. The first LDD regions 15 are preferably implanted with an energy of less than 30 keV (e.g., from 5 to less than 30 keV; the lowest energy providing functional VLDD implants is more preferred).

Figure 2D:
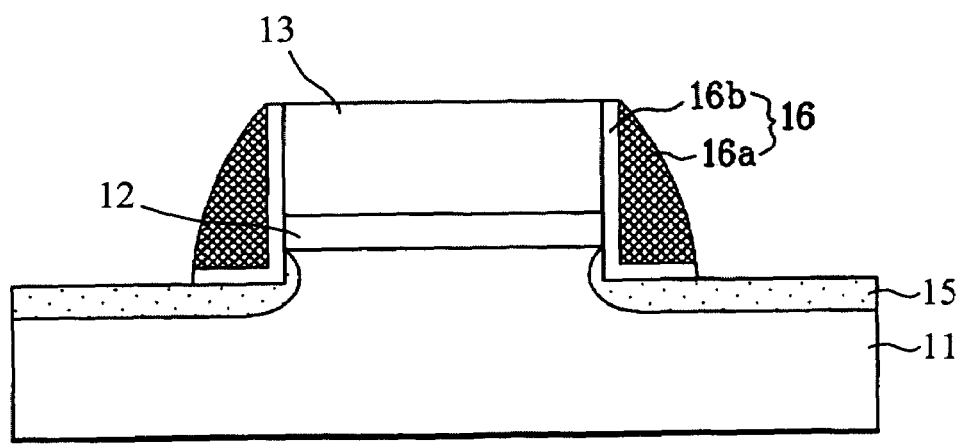

Referring to FIG. 2D, spacers 16 are formed on sidewalls of the gate electrode 13. Namely, an oxide layer and a nitride layer are stacked (e.g., by blanket deposition) over the substrate 11 provided with the first LDD regions 15, and the oxide and nitride layers are then anisotropically etched to form the oxide spacer structures 16b and nitride spacer structures 16a on the sidewalls of the gate electrode 13. Alternatively, the spacers 16 can be formed from (i.e., may comprise) a single layer of either nitride or oxide. Yet, a dual layer spacer such as spacer 16 is frequently used to enhance a leakage current characteristic (e.g., reduce the vertical leakage current) of an integrated device.

Figure 2E:
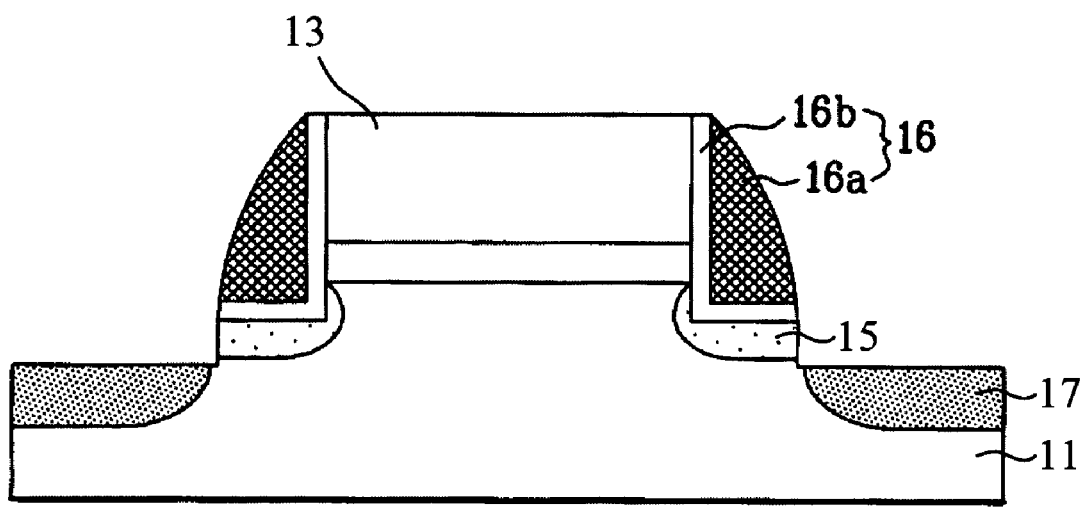

Referring to FIG. 2E, source/drain regions 17 are formed, and the substrate 11 is then etched to a prescribed depth. Namely, impurity ion implantation is carried out on the substrate 11 using the spacers 16 (and the gate electrode 13) as an implantation mask to form the source/drain regions 17. In doing so, the source/drain regions 17 correspond to a doped type, P or N, of a semiconductor device. Specifically, when a PMOS area is exposed only (i.e., masking off the NMOS areas using a photoresist) by the resultant structure provided with the spacers 16, p+ ions are heavily implanted into the substrate to form p+ source/drain regions. After a photoresist pattern exposing an NMOS area only is formed over the substrate, n+ ions are heavily implanted into the substrate to form n+ source/drain regions.

Subsequently, the substrate 11 provided with the source/drain regions 17 is etched to a prescribed depth using the gate electrode 13 and spacers 16 as an etch mask so that the first LDD regions 15 can be separated from the source/drain regions 17, respectively. Preferably, the prescribed depth of etching the substrate 11 is equal to or smaller than 500 Å, but generally greater than the depth to which the first LDD regions 15 are formed. Hence, by separating the first LDD regions 15 from the source/drain regions 17, the heavily doped impurities in the source/drain regions 17 may be inhibited or prevented from diffusing into the first LDD regions 15.

Figure 2F:
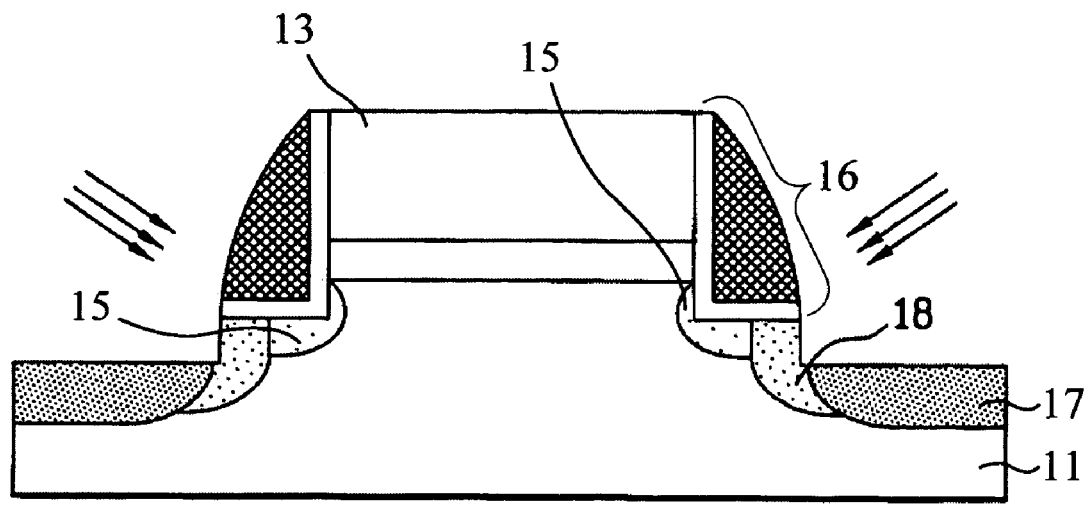

Referring to FIG. 2F, second LDD regions 18 are formed. Namely, impurity ions are implanted into the substrate 11 provided with the first source/drain regions 15 and the source/drain regions 17 to form second LDD regions 18 using the gate electrode 13 and spacers 16 as an implantation mask again. Preferably, the second LDD regions 18 have an impurity ion density higher than that of the first LDD regions 15, but lower than that of the source/drain regions 17. In doing so, the above ion implantation for the second LDD regions 18 can be carried out in a vertical direction. Alternatively, in order to connect the first and second LDD regions more effectively, the ion implantation to define the second LDD regions 18 is carried out at an angle of from about 10° to about 80°. In one implementation, the implant angle is about 45°. Finally, the first LDD regions 15, second LDD regions 18, and source/drain regions 17 are stabilized through annealing.

As explained in the foregoing description, the substrate is etched to provide stepped LDD regions wider than the related art LDD regions so that the horizontal electric field of the gate electrode can be reduced to lower the leakage current. In addition, a graded dopant density is provided to the LDD regions (from the VLDD regions 15, through the second LDD regions 18, to the source/drain regions 17) so that the drivability of the transistor can be enhanced. For example, VLDD regions 15 may have a dopant density of from about $10^{-13}$ to about $10^{-14}$ atoms/cm$^2$, the second LDD regions 18 may have a dopant density of from about $5\times10^{-14}$ to less than $5\times10^{-15}$ atoms/cm$^2$ (e.g., about $10^{-15}$ atoms/cm$^2$), and the source and drain 17 may have a dopant density greater than the LDD regions 18 (in one implementation, about $5\times10^{-15}$ atoms/cm$^2$).

Accordingly, the present invention etches the substrate to configure a step shape thereto and increase a size of the LDD regions, thereby reducing the horizontal electric field of the gate electrode to lower the leakage current.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor device comprising:
    first LDD regions and source/drain regions in a semiconductor substrate comprising a first step having a height equal to or smaller than 500 Å and a second step adjacent to the first step, the second step having a height equal to or smaller than 500 Å;
    a channel region between the first LDD regions;
    a gate insulating layer on the semiconductor substrate over the channel region;
    a gate electrode on the gate insulating layer over the channel region;
    a spacer on a sidewall of the gate electrode; and
    second LDD regions provided between the first LDD regions and the source/drain regions, wherein the semiconductor substrate has a shape adapted to separate the first LDD regions from the source/drain regions.

2. The semiconductor device of claim 1, wherein the second LDD regions have an impurity density higher than that of the first LDD regions but lower than that of the source/drain regions.

3. The semiconductor device of claim 1, wherein the channel region is defined at least in part by the first step.

4. The semiconductor device of claim 1, wherein the first LDD regions are partly in the first step and partly in the second step.

5. The semiconductor device of claim 4, wherein the second LDD regions are not in the first step, but partly in the second step.

6. The semiconductor device of claim 5, wherein the source/drain regions are not in either the first step or the second step.

7. A method of fabricating a semiconductor device, comprising the steps of:
    stacking an oxide layer and a conductive layer on a semiconductor substrate;

forming a gate electrode by patterning at least the conductive layer;
etching the substrate exposed by the patterned gate electrode to a first depth;
forming a first LDD region in the etched substrate;
forming a spacer on a sidewall of the gate electrode;
forming a source/drain region in the substrate having the spacer;
etching the substrate having the source/drain region to a second depth; and
forming a second LDD region between the first LDD region and the source/drain region of the etched substrate.

8. The method of claim 7, wherein the semiconductor substrate is etched to the first depth using an etch mask for forming the gate electrode.

9. The method of claim 7, wherein the first depth is equal to or smaller than 500 Å.

10. The method of claim 7, wherein the substrate is etched to the second depth using the gate electrode and the spacer as an etch mask.

11. The method of claim 7, wherein the second depth is greater than the first depth.

12. The method of claim 7, wherein the second depth is equal to or smaller than 500 Å.

13. The method of claim 7, wherein the second LDD region has an impurity density higher than that of the first LDD region but lower than that of the source/drain region.

14. The method of claim 7, wherein the second LDD region is formed by ion implantation at an implantation angle of from 10° to about 80°.

* * * * *